United States Patent

Nummila

Patent Number: 5,912,588
Date of Patent: Jun. 15, 1999

[54] GAIN CONTROL CIRCUIT FOR A LINEAR POWER AMPLIFIER

[75] Inventor: Kari Nummila, Helsinki, Finland

[73] Assignee: Nokia Mobile Phones Ltd., Espoo, Finland

[21] Appl. No.: 08/886,379

[22] Filed: Jul. 1, 1997

[30] Foreign Application Priority Data

Jul. 11, 1996 [FI] Finland ................................... 962814

[51] Int. Cl.$^6$ .................................................. H03F 3/45
[52] U.S. Cl. .......................... 330/254; 330/149; 455/126
[58] Field of Search ................................. 330/149, 129, 330/254, 252; 455/126

[56] References Cited

U.S. PATENT DOCUMENTS

| 5,091,919 | 2/1992 | Kuisma | 375/60 |
| 5,123,031 | 6/1992 | Kuisma | 375/60 |
| 5,204,881 | 4/1993 | Cardini et al. | 330/149 |
| 5,256,984 | 10/1993 | Lee | 330/254 |
| 5,258,722 | 11/1993 | Jeffers | 330/149 |
| 5,289,136 | 2/1994 | DeVeirman et al. | 330/252 |
| 5,598,127 | 1/1997 | Abbiati et al. | 330/149 |

FOREIGN PATENT DOCUMENTS

| 0397265 | 11/1990 | European Pat. Off. . |
| 0597420 A1 | 5/1994 | European Pat. Off. . |
| 0658975 A1 | 6/1995 | European Pat. Off. . |
| 0720112 A1 | 7/1996 | European Pat. Off. . |
| 98014 | 12/1996 | Finland . |
| 1084963 | 4/1984 | U.S.S.R. . |
| 2280073 | 1/1995 | United Kingdom . |

OTHER PUBLICATIONS

IEEE Journal of Solid–State Circuits, vol. 26, No. 11, pp. 1673–1680, Nov. 1991, "A DC To 1–GHz Differential Monolithic Variable–Gain Amplifier", Meyer et al.

IEEE Transactions on Microwave Theory and Techniques, vol. 41, No. 12, pp. 2295–2302, Dec. 1993, "Monolithic GaAs HBT p–i–n Diode Variable Gain Amplifiers, Attenuators, and Switches", Kobayashi et al.

IEEE Journal of Solid–State Circuits, vol. 29, No. 10, pp. 1257–1261, Oct. 1994, "GaAs HBT 0.75–5 GHz Multifunctional Microwave–Analog Variable Gain Amplifier", Kobayashi et al.

Primary Examiner—Benny T. Lee
Assistant Examiner—Khanh Van Nguyen
Attorney, Agent, or Firm—Perman & Green, LLP

[57] ABSTRACT

The invention relates to the gain control of radio amplifiers. In an amplifier circuit according to the invention, the employed output level is a differential pair provided with a tanh$^{-1}$ predistorter as a control device. The predistortion is adjusted so that the differential pair operates all the time in the linear region, when the bias current $I_E$ and the transconductance of the pair are changed. By using the amplifier circuit according to the invention, there is achieved linear operation within a wide range of output power.

7 Claims, 7 Drawing Sheets

GAIN CONTROL CIRCUIT FOR A LINEAR POWER AMPLIFIER

FIELD OF THE INVENTION

The invention relates to controlling the amplification of radio amplifiers.

BACKGROUND OF THE INVENTION

Gain-controllable amplifiers are important particularly in mobile telephones, where the majority of the power is consumed in generating the output power for the transmitter. The output power must be adjustable in order to reduce power consumption when the connection to the base station can be maintained with a power level lower than the full output power. For instance in a GSM system, the base station controls in a centralized manner the output power of all telephones located within its range, in order to minimize their power consumption. Typically the output power of a transmitter is controlled by adjusting the amplification of the power amplifier of the transmitter.

Normally, a cellular telephone operates at less than the maximum transmitting power. The full power is needed in a cellular network only near the edges of the cells, i.e. when the distance to a base station is long. The cellular network controls the transmitting power of the mobile units by measuring the received strength of the signals transmitted by the mobile units and transmit commands to the mobile units to adjust their transmitting power to a suitable level. If the received signal is too weak, the particular mobile unit is given a command to raise its transmitting power. On the other hand, if the strength of the received signal is so high, that the transmitting power can be decreased without essentially decreasing the signal quality, the mobile unit is given a command to reduce its transmitting power. This kind of transmitting power control is used to optimize the power consumption of the mobile units, thereby lengthening the time a mobile unit can be used without recharging its battery. Also, the reduction of transmitting power also reduces the amount of interference the transmission of different mobile units cause to each others' signals. The power levels used by typical digital cellular telephones, such as GSM, PCN, or DCS cellular telephones, can typically be varied in the range 0 dBm to +33 dBm (1 mW to 2 W). This level range is so large, that the characteristics of the power amplifier stage, for example linearity, are very different at the minimum power level and at the maximum power level.

In high frequency technology, there are known several ways for controlling the amplification of an amplifier, such as controllable transconductance, controllable feedback, current partitioning and the use of a controllable attenuation stage. All these control methods are described in more detail in the specification below.

The amplification of the amplifier stage can be adjusted for instance by changing the transconductance of the amplifier transistor. A general feature of transistors is the dependence of the transconductance $g_m$ on the quiescent current of the transistor, and hence with a suitable adjustable amplifier transistor bias circuit an adjustable amplifier can be created. As an example of this type of an amplifier stage, FIG. 1 illustrates a differential emitter-coupled pair 2, the transconductance $g_m$ whereof depends on the level of the current $I_E$. The current $I_E$ is controlled by a constant current element 1. This type of fully differential circuits have the drawback that their linear range of operation is limited. However, structures based on a differential pair, are well suited to be integrated, wherefore they are generally used in devices realized with integrated circuits.

Amplification can also be controlled by adjusting the feedback resistance of the amplifier stage. FIG. 2 illustrates a simple basic circuit arrangement of an amplifier stage, where the amplification of the amplifier stage can be controlled by means of the resistance Rf. An adjustable resistance is often accomplished by using a PIN diode or a FET transistor. In microwave technology, this type of structure is often realised with discrete components in a hybrid circuit. Some drawbacks of this structure are the limited scale of bandwidth and amplification range.

An amplification control circuit applying current partitioning adjusts the current to be directed past the load resistance. In the exemplary circuit of FIG. 1, the current steered by the differential pair 2 passes as a whole via the load resistances $R_L$. When a Gilbert quad is added to this type of circuit, in a manner illustrated in FIG. 3, part of the current drained by the differential pair can be conducted past the resistances $R_L$, in which case the circuit amplification decreases in proportion to the currents passing via the resistances $R_L$ and past them. A drawback of this type of control circuit is poor efficiency, because the current conducted past the load resistance is not utilized.

An adjustable amplification can also be accomplished by means of an attenuator to be coupled as a preliminary stage for the amplifier stage. In an arrangement of this type, the amplification of the actual output stage is constant, and the amplification of the whole amplifier coupling is controlled by increasing or decreasing the attenuation of the attenuator. This type of attenuator can be realised for instance by using PIN diodes.

As a conclusion of the prior art arrangements, let us point out that most solutions have drawbacks with respect to efficiency, linearity or dynamic range. Moreover, many of the known solutions are difficult to accomplish with current microcircuit techniques, and are therefore poorly suited for instance to portable radio devices, where the aim is to use compact components that take up as little space as possible.

Problems with linearity of a certain signal processing block such as an amplifier can be corrected to a large extent by adding a predistorter stage whose linearity characteristics are the inverse of the signal processing block. Such solutions are exemplified by the system described in the European patent application EP 720112, where a predistorter stage counters the errors introduced by nonlinearities in a signal processing block. One other example is the Finnish patent FI 98014, which describes the use of a predistorter stage prior to an amplifier stage for correcting the nonlinearities of the amplifier stage. These solutions have the drawback that by adding a functional block, they increase the complexity of the system and the manufacturing costs.

SUMMARY OF THE INVENTION

The object of the invention is to accomplish a linear amplifier with amplification that can be controlled within a wide output power range. Another object of the invention is to realize an amplifier, in the output stage whereof there can be used a simple, non-linear structure, based for instance on a differential pair.

These aims and objects are achieved by coupling, as a preliminary stage for the output stage, a predistorter, the operation curve whereof is inverted in relation to the operation curve of the output stage. A preferred embodiment of the invention uses a differential pair as an amplifier controlled via the transconductance, with a $\tanh^{-1}$ predistortion circuit coupled to the input of said pair in order to control said differential pair. Predistortion is adjusted so that the differential pair operates all the time within the linear region, when the current $I_E$ and the transconductance of the pair are being changed.

The system according to the invention is characterized in that the system comprises an amplifier stage with a certain operation curve, and a predistorter that has an inverted operation curve in relation to said amplifier stage, in order to linearize the operation curve of the amplifier system; and that said predistorter also is arranged to control the amplification of the amplifier system.

In the system according to the invention, predistortion and amplification control are realised in one and the same circuit element. In a preferred embodiment of the invention, where a $\tanh^{-1}$ predistortion circuit is employed for controlling the differential pair, by selecting the operation point of the $\tanh^{-1}$ predistortion circuit it is also possible to simultaneously adjust both the amplification and the predistortion. Moreover, amplification can be controlled in a conventional manner by adjusting the level of the current $I_E$ that defines the operation point of the differential pair. In the system according to the invention, there is achieved a larger amplification control range than in the prior art technology.

BRIEF DESCRIPTION OF THE DRAWINGS

The invention is explained in more detail below, with reference to a few preferred embodiments as examples, and to the appended drawings, where.

Like reference numbers and symbols for like parts are used in the drawings.

DETAILED DESCRIPTION OF THE INVENTION

Figure 1:
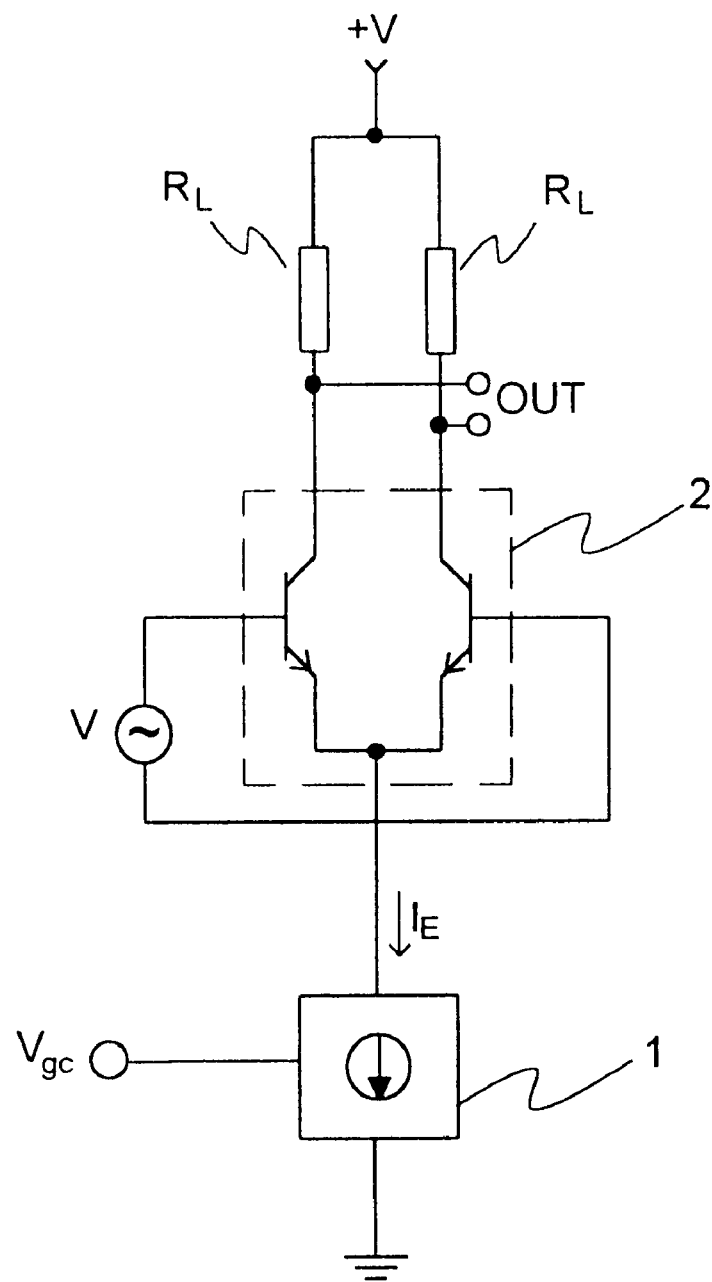
FIG. 1 illustrates a prior art differential pair.
Figure 2:
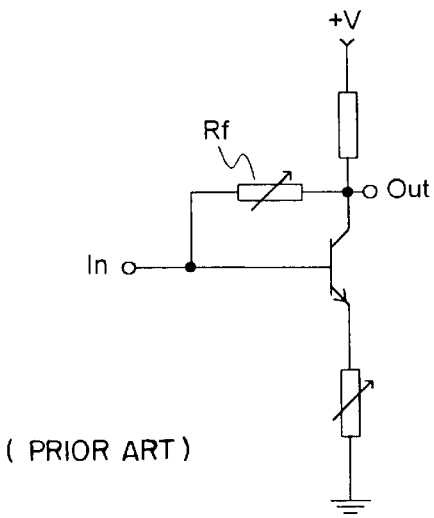
FIG. 2 illustrates a prior art arrangement for amplification control.
Figure 3:
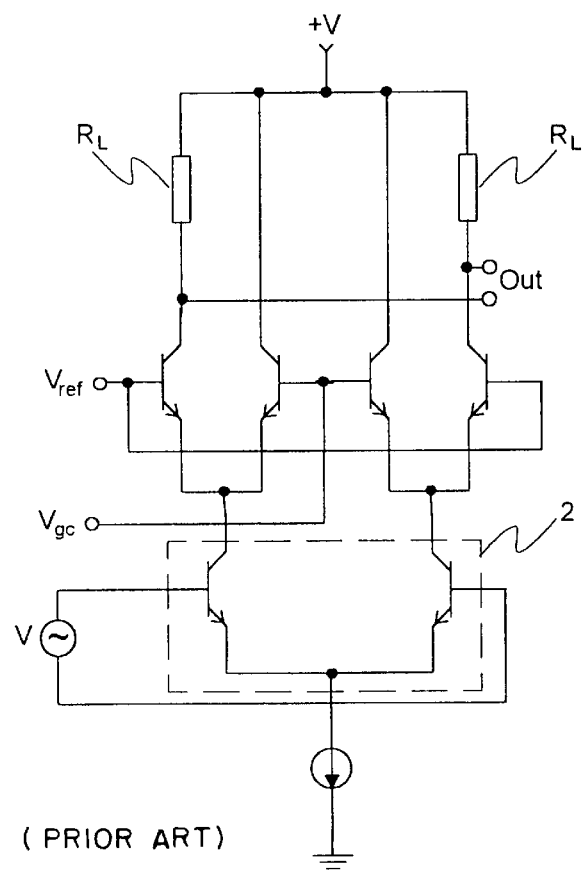
FIG. 3 illustrates another prior art arrangement for amplification control.
Figure 4:
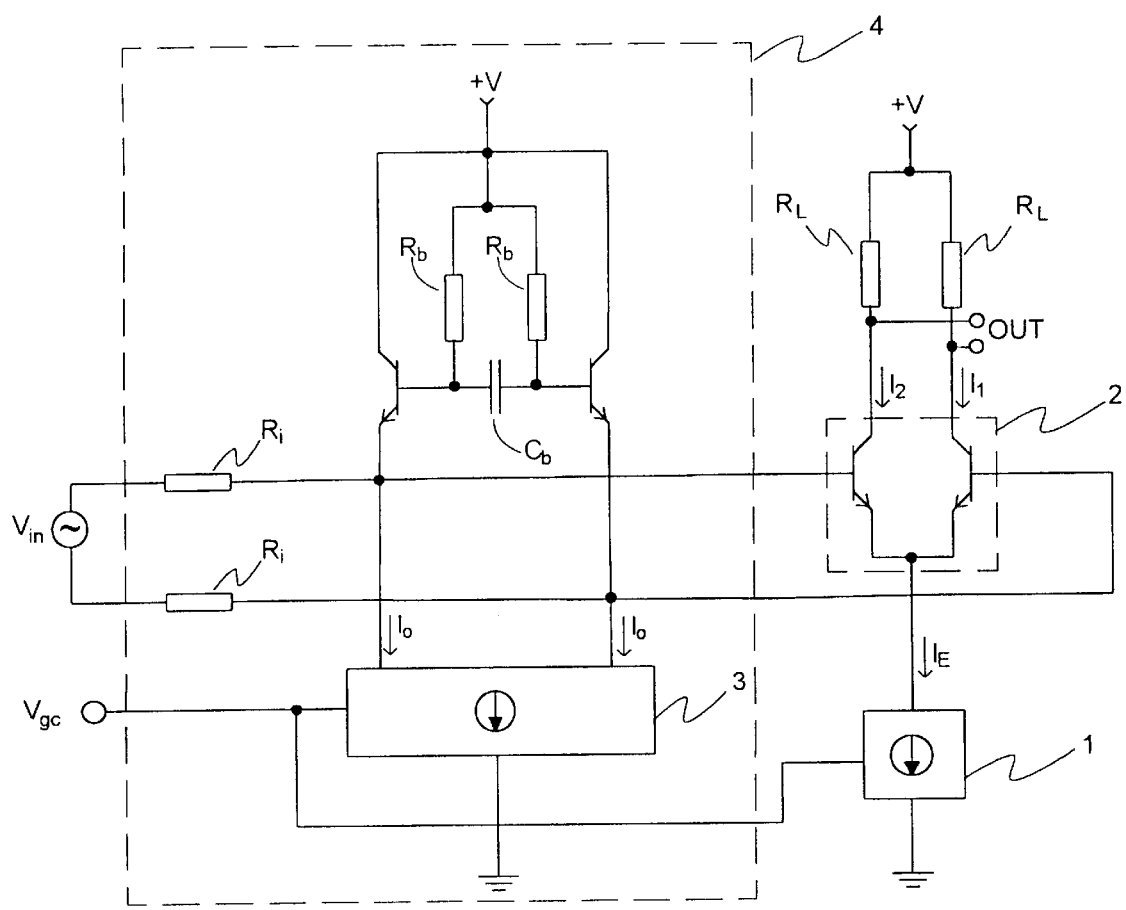
FIG. 4 illustrates an arrangement according to the invention.

The amplification control circuit according to the invention is based on the use of a differential pair 2 as an adjustable transconductance stage, and on the use of a $\tanh^{-1}$ predistortion circuit as a preliminary transconductance stage. A diagram in principle of the amplification circuit according to the invention is illustrated in FIG. 4. The output current of the differential pair, i.e. the difference of the two collector currents $\Delta I = I_1 - I_2$, is dependent on the input voltage (V in FIG. 1) of the differential pair as follows:

$$\Delta I = I_1 - I_2 = I_E(V_{gc})\tanh(V/2V_T) \qquad (1)$$

where $V_T$ is the thermal voltage of the transistor. The dynamic range of the output OUT is defined according to the measures of the differential pair. In a system according to the invention, the differential pair is controlled by a $\tanh^{-1}$ predistortion circuit 4. The output voltage $V_{out}$ of such a predistortion circuit is dependent on the input voltage $V_{in}$ of the predistortion circuit as follows:

$$V_{out} = 2V_T \tanh^{-1}((V_{in} - V_{out})/2R_i I_o(V_{gc})), \qquad (2)$$

where $|V_{in} - V_{out}| \leq 2 R_i I_o(V_{gc})$. The slope of the operation curve of the predistortion circuit can be adjusted by changing the magnitude of the current $I_o$. The constant current element 3 maintains the magnitude of the current $I_o$ constant, at a value defined by the control voltage $V_{gc}$. In addition to the current $I_o$, the linearity and the dynamic range of the predistortion circuit 4 can also be adjusted by the resistances $R_i$ and $R_b$ as well as by the capacitance $C_b$. However, the resistances $R_b$ and the capacitance $C_b$ are not necessary for the operation of the circuit, i.e. the circuit also operates when the value of the resistances $R_b$ is 0Ω and the value of the capacitance $C_b$ is 0 pF.

When the predistortion circuit 4 and the differential pair 2 are combined, in a fashion illustrated in FIG. 4, we obtain the result $$\Delta I = (I_E(V_{gc})/2R_i I_o(V_{gc}))(V_{in} - V_{out}) \approx (I_E(V_{gc})/2R_i I_o(V_{gc}))V_{in}, \qquad (3)$$

in which case the output current $\Delta I$ of the amplifier circuit is linearly dependent on the input voltage $V_{in}$, in a proportion defined by the currents $I_E$ and $I_o$. The task of the predistorter 4 is to modify the signal transmitted to the differential stage, so that the differential stage does not enter the non-linear range of operation. Now the differential stage can be a non-linear differential pair, like the one illustrated in FIG. 4. The predistorter 4 also changes the signal level, which feature in the arrangement according to the invention is utilised in the gain control.

Figure 5:
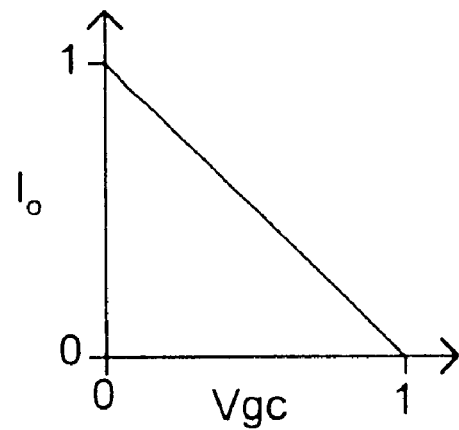
FIG. 5 is a schematic illustration of the operation curve of the constant current element 3, i.e. the dependence of the current $I_o$ on the control voltage $V_{gc}$.
Figure 6:
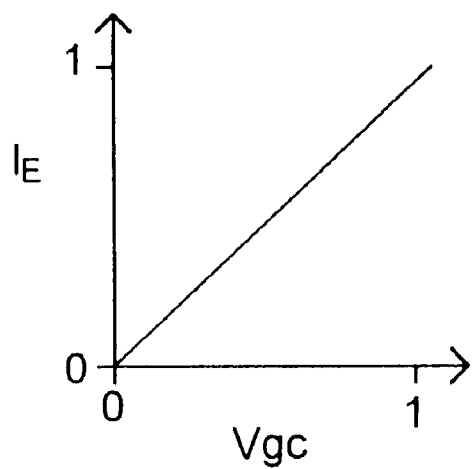
FIG. 6 is a schematic illustration of the operation curve of the constant current element 1, i.e. the dependence of the current $I_E$ on the control voltage $V_{gc}$.

The amplification in the predistortion circuit is adjusted by means of the current $I_o$, so that the differential pair 2 remains all the time in the linear region. In order to achieve this, the current $I_o$ is changed to the opposite direction when compared to the current $I_E$, when the transconductance of the differential pair is changed by changing the current $I_E$. The constant current elements 1 and 3 are thus arranged to adjust the current according to the control voltage $V_{gc}$, in a direction opposite to each other. FIG. 5 is a schematic illustration of the dependence of the current $I_o$ of the control voltage $V_{gc}$, and FIG. 6 illustrates the dependence of the current $I_E$ on the control voltage $V_{gc}$.

In the arrangement according to the invention, the control quantity of the currents $I_o$ and $I_E$, i.e. the control quantity of the constant current means 1 and 3, can also be a signal of some other type than the control voltage $V_{gc}$. The constant current elements 1 and 3 can be controlled for instance by using a current signal.

By suitably defining the measures of the differential stage and the predistorter, the amplification control is made to function within the same range of operation where the predistorter maintains the differential stage linear.

Figure 7:
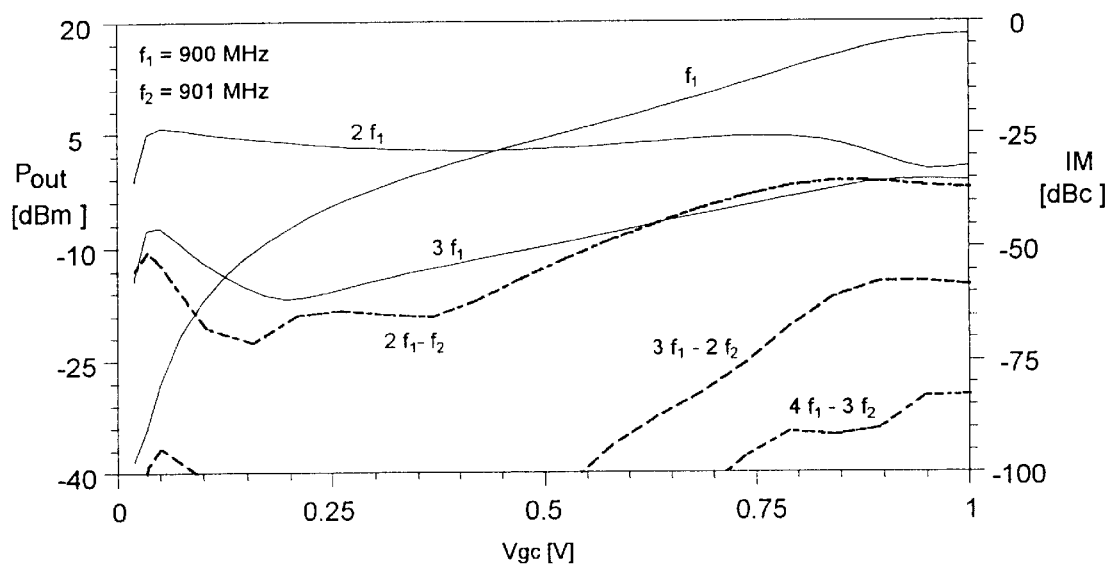
FIG. 7 illustrates the characteristics of the amplification circuit according to the invention.

FIG. 7 illustrates the results of a circuit simulation as for the features of an amplifier according to the invention. The curve $f_1$, represents the amplifier output power in dBm units, and the rest of the curves represent the power level of the multiple frequencies and interrnodulation results in comparison with the fundamental frequency $f_1$ in dBc units. From the graph it will be noted that the level of the multiples $2f_1$, $3f_1$ of the fundamental frequency is at least 25 dBc below the level of the fundamental frequency $f_1$, and the level of the intermodulation results $2f_1-f_2$, $4f_1-3f_2$ is at least 35 dBc below the level of the fundamental frequency.

Figure 8:
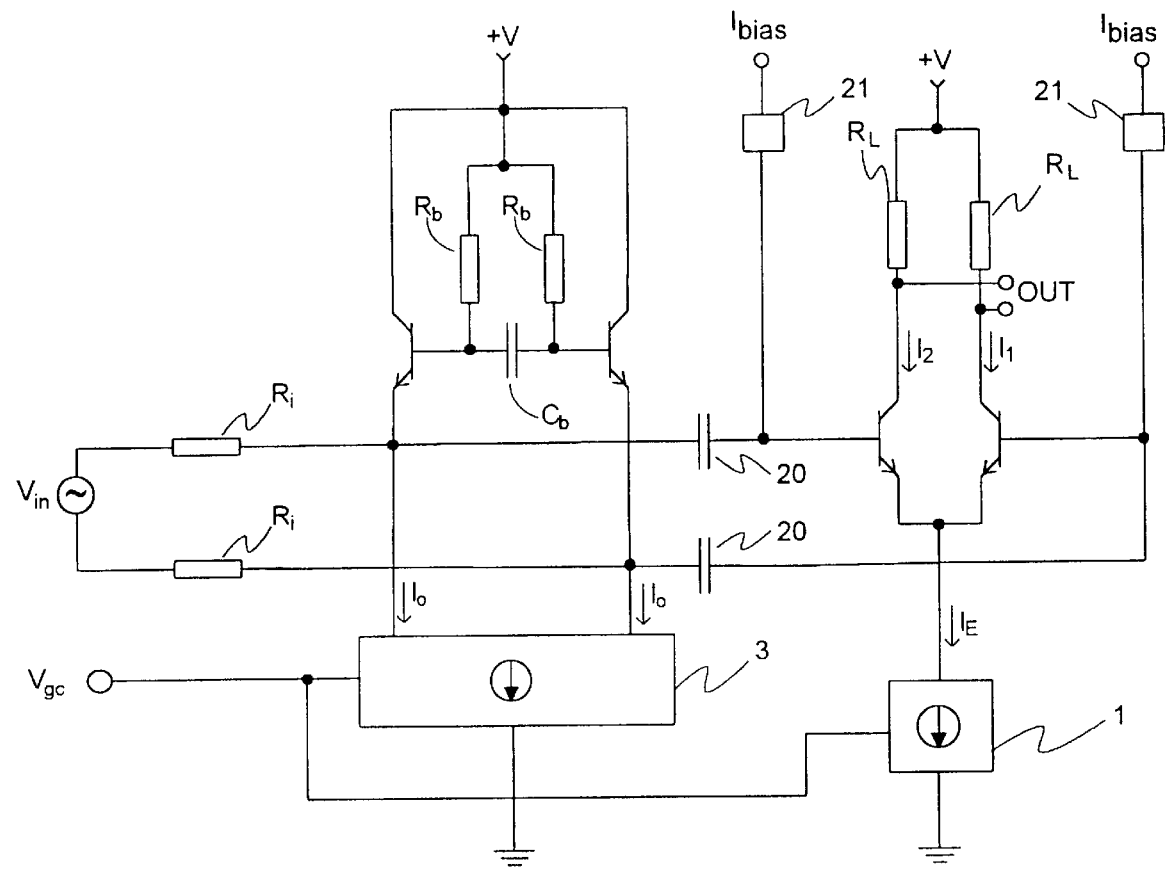
FIG. 8 illustrates another arrangement according to the invention.

FIG. 8 illustrates another possible preferred embodiment of the invention. In this solution, the bias currents $I_{bias}$ of the transistors of the differential pair are not brought from the predistorter, as in FIG. 4, but from a separate biasing circuit (not illustrated). In this case the direct voltages of the emitters of the predistorter transistors must be separated from the voltages of the bases of the differential pair for instance by means of capacitances 20. In order to minimize high-frequency losses, the biasing circuit must be separated from the transistors of the differential pair, for example by using suitable inductances 21. From the point of view of a high-frequency signal, the embodiment of FIG. 8 is essentially similar to the embodiment of FIG. 4.

Figure 9:
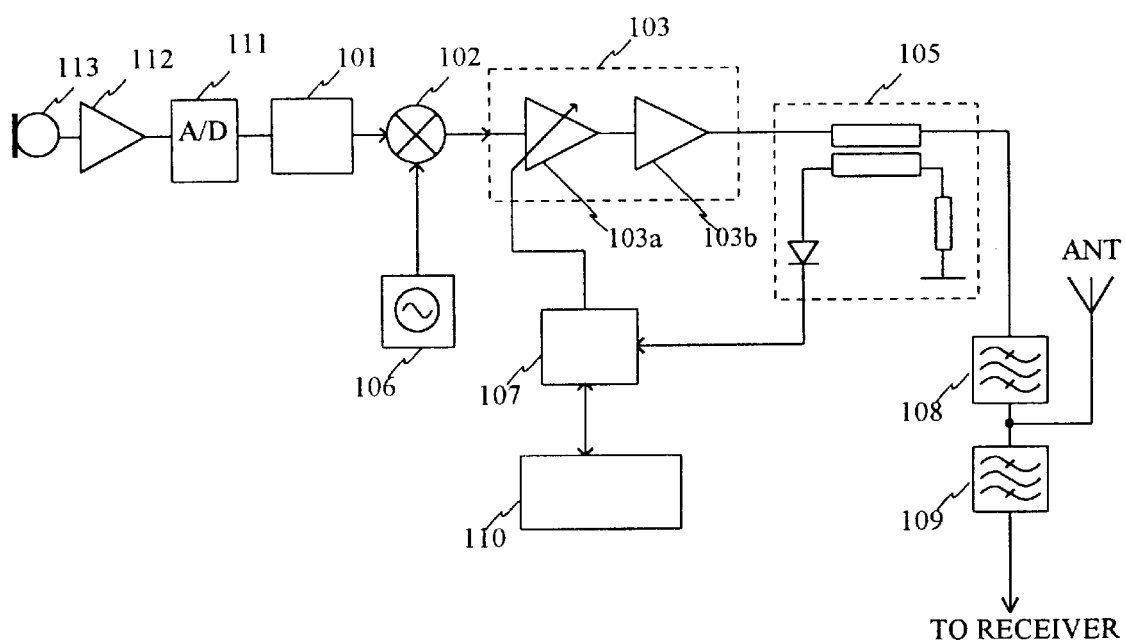
FIG. 9 illustrates another embodiment of the invention, where the circuit according to the invention is employed within the RF power amplifier of a cellular telephone.

FIG. 9 shows an example of an advantageous application of the circuit according to the invention. FIG. 9 shows a block diagram of the transmitter section of a mobile cellular telephone. The block diagram of the receiver section is omitted for clarity. The signal of the microphone 113 is amplified by a microphone amplifier stage 112 and converted to digital form in an A/D converter 111. The digital signal is processed by the modulator 101 to produce a modulated signal, which is mixed in mixer 102 with the signal of the local oscillator 106 to form the high frequency signal to be transmitted. The high frequency signal is amplified by the power amplifier block 103 and taken to the antenna through the power detector 105 and bandpass filter 108. The receiver bandpass filter 109 prevents the output power of the transmitter section from damaging the circuits of the receiver section (not shown). The output of the power detector 105 is taken to the power control block 107, which maintains the output power of the power amplifier block 103 at the desired level. The control unit 110 of the telephone, which typically controls the operation of the telephone, informs the power control block 107 as to which is the power level to be maintained. In the embodiment of FIG. 9, the circuit according to the invention is used as a combined predistorter and gain control stage 103a for predistorting and adjusting the level of the signal, which is taken to the amplifier stage 103b of the power amplifier block 103.

The components of the exemplary circuits illustrated above, such as the constant current elements 1 and 3, represent prior art technology, known as such for a man skilled in the art.

The emitter-coupled differential pair described in the examples is not the only possible solution for the differential stage 2. In an arrangement according to the invention, there can also be used other known differential amplifier stages, for instance the arrangements described in the U.S. Pat. No. 5,289,136 (De Veirman et al.). In the following claims, the term "differential pair" stands for any structure principally based on the differential pair, for example for the structures described in the U.S. Pat. No. 5,289,136 (De Veirman et al.).

Likewise, it is apparent for a man skilled in the art that in a system according to the invention, the $\tanh^{-1}$ predistortion circuit can be realized by using other prior art arrangements, too.

It is also apparent for a man skilled in the art that the amplifier circuit according to the invention can be used as a separate circuit or as part of a larger amplifier chain.

The invention is particularly well suited to applications where the linearity of the amplification control is important. Such features are needed for instance in the amplifiers of JDC and DAMPS/CDMA based telecommunications systems.

Linearly the amplifier according to the invention operates on a very wide output power range, in which case the level of harmonic multiples and intermodulation results remains low. Moreover, the amplifier circuit according to the invention can be used within a very large power range of the input signal.

In an amplifier coupling according to the invention, there can be used a completely differential structure. Moreover, the structure according to the invention allows the use of an amplifier, apart from differential input and output, also with a single-ended input and output.

The structure according to the invention is compatible with modern integration techniques and thus extremely well suited to be used in portable radio devices.

What is claimed is:

1. An amplifier system, characterized in that the amplifier system comprises an amplifier stage with a certain operation curve, and a predistorter that has an inverted operation curve, in relation to said amplifier stage, in order to linearize the operation curve of the amplifier system; and that said predistorter also is arranged to control the amplification of the amplifier system, further characterized in that said amplifier stage is a differential pair.

2. An amplifier system, characterized in that the amplifier system comprises an amplifier stage with a certain operation curve, and a predistorter that has an inverted operation curve, in relation to said amplifier stage, in order to linearize the operation curve of the amplifier system; and that said predistorter also is arranged to control the amplification of the amplifier system, further characterized in that said predistorter is a $\tanh^{-1}$ predistorter.

3. An amplifier system according to claim 1, characterized in that said amplifier stage comprises an adjustable constant current element (1) in order to adjust the bias current and operation point of said differential pair.

4. An amplifier system according to claim 2, characterized in that said predistorter comprises an adjustable constant current element (3) in order to adjust a bias current and operation point of said predistorter.

5. An amplifier system characterized in that the amplifier system comprises an amplifier stage with a certain operation curve, said amplifier stage comprising a differential pair, and a predistorter that has an inverted operation curve, in relation to said amplifier stage, in order to linearize the operation curve of the amplifier system; and that said predistorter also is arranged to control the amplification of the amplifier system, wherein said predistorter is a $\tanh^{-1}$ predistorter, wherein said amplifier stage comprises an adjustable constant current element (1) in order to adjust the bias current and operation point of said differential pair; wherein said predistorter comprises an adjustable constant current element (3) in order to adjust the bias current and operation point of said predistorter; and wherein, in order to control the amplification of the amplifier system and linearize the amplifier system, said constant current element (3) of the predistorter is arranged to reduce the bias current of the predistorter with those values of a control quantity ($V_{gc}$) of the constant current element with which said constant current element (1) of the differential pair is arranged to increase the bias current of the differential pair, and to increase the bias current of the predistorter with those values with which said constant current element (1) of the differential pair is arranged to reduce the bias current of the differential pair.

6. A radiotelephone comprising a reception part and a transmission part, said transmission part comprising:

an RF amplifier system comprising an amplifier circuit having an associated operation curve, said amplifier circuit comprising a differential pair, said RF amplifier system further comprising a predistorter circuit that has an inverted operation curve, in relation to said operation curve of said amplifier circuit, for linearizing an overall operation curve of said RF amplifier system and for controlling the amplification of said RF amplifier system.

7. A radiotelephone comprising a reception part and a transmission part, said transmission part comprising:

an RF amplifier system comprising an amplifier circuit having an associated operation curve, said amplifier circuit comprising a differential pair, said RF amplifier system further comprising a predistorter circuit that has an inverted operation curve in relation to said operation curve of said amplifier circuit for linearizing an overall operation curve of said RF amplifier system, wherein said predistorter circuit is coupled to said amplifier circuit and controls, at least in part, the amplification of said RF amplifier system;

wherein said amplifier circuit comprises a first adjustable constant current circuit that is settable with a first input signal to adjust the bias current and operation point of said differential pair;

wherein said predistorter circuit comprises a second adjustable constant current circuit that is settable with a second input signal to adjust the bias current and operation point of said predistorter circuit; and wherein, for controlling the amplification and linearization of said amplifier system, said first input signal of said first constant current circuit and said second input signal of said second constant current circuit are coupled to a same input signal such that an increase in bias current of said differential pair results in a decrease in the bias current of said predistorter circuit, while a decrease in bias current of said differential pair results in an increase in the bias current of said predistorter circuit.

* * * * *